United States Patent [19]
Barclay et al.

[11] 4,265,543
[45] May 5, 1981

[54] KERR EFFECT APPARATUS

[75] Inventors: Donald J. Barclay, Winchester; Christopher T. Prowting, Eastleigh, both of England

[73] Assignee: International Business Machines Corporation, Armonk, N.Y.

[21] Appl. No.: 936,417

[22] Filed: Aug. 24, 1978

[30] Foreign Application Priority Data

Aug. 24, 1977 [GB] United Kingdom ............... 35572/77

[51] Int. Cl.³ .......................... G01J 4/04; G02F 1/05
[52] U.S. Cl. .................................... 356/369; 350/375
[58] Field of Search ................ 356/368, 369; 350/151; 250/225, 227

[56] References Cited
FOREIGN PATENT DOCUMENTS 1414353 11/1975 United Kingdom .

*Primary Examiner*—Vincent P. McGraw
*Assistant Examiner*—Rodney Bovernick
*Attorney, Agent, or Firm*—Ronald L. Drumheller

[57] ABSTRACT

A miniature Kerr effect probe is described which may be used to examine surfaces of magnetic material during electroplating or vacuum deposition, without requiring a specially shaped bath or chamber.

The probe consists of a U-shaped core with adjacent pole tips of soft magnetic material wound with a coil to provide a magnetic field across the ends of the arms of the core which constitute probe tips. In use, these probe tips are placed adjacent to a surface being examined. Optic fibers are used to direct light to and from the surface.

The polarizer and analyzer required for Kerr work may be at the probe tips or remote from the probe tips due to the availability of optic fibers which will transmit polarized light without distortion. The light beam at the probe tips may be collimated or focussed by the optic fiber.

12 Claims, 6 Drawing Figures

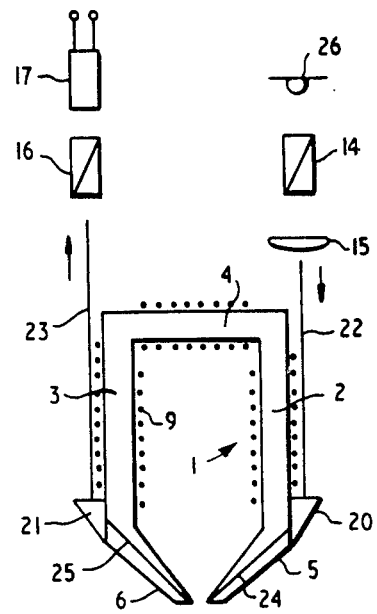
FIG. 4
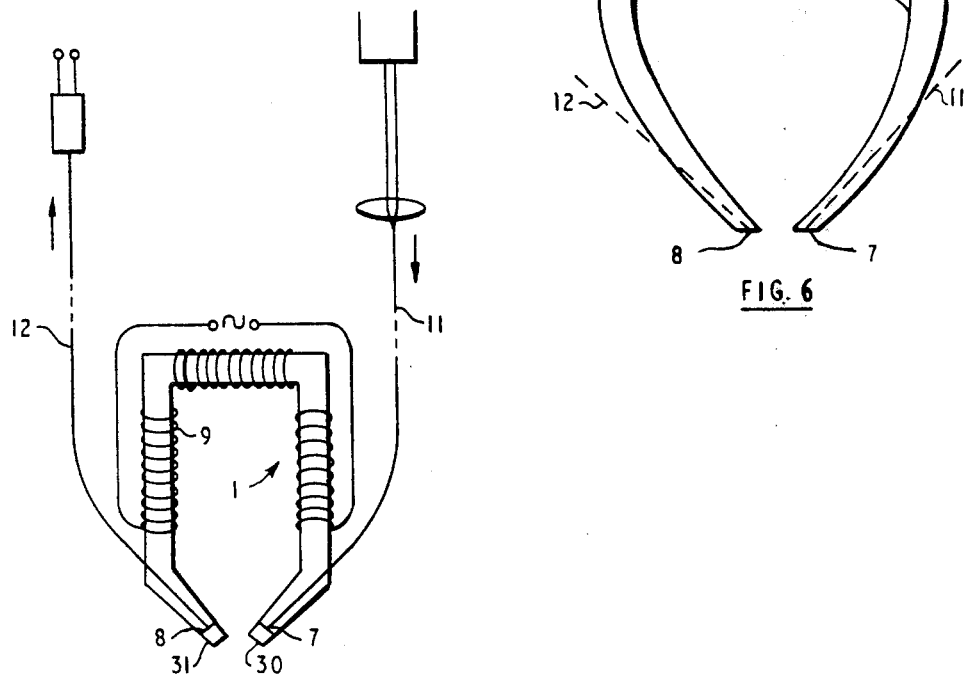
FIG. 5
FIG. 6

KERR EFFECT APPARATUS

DESCRIPTION

1. Technical Field

This invention relates to Kerr Magneto-optic effect apparatus which enables monitoring magnetic surfaces during processing without requiring the use of a specialized plating bath or vacuum deposition chamber.

2. Background Art

When polarized light is reflected from a magnetized surface, the polarization of the incident light is changed. This change is known as the Kerr magneto-optic effect.

In the prior art, an article by K. Y. Ahn entitled "In-situ Measurement of Magnetic Properties in Vacuum-Deposited Permalloy Films," published in the IBM Journal of Research and Development, November 1966, pages 477–483 describes use of the Kerr magneto-optic effect. In the apparatus described, a specially shaped chamber containing coils for generating magnetic fields is required to examine properties of magnetic films during and after film deposition.

United Kingdom Pat. No. 1,414,353 by IBM United Kingdom Limited entitled "Apparatus for Electrolytically Plating Ferromagnetic Alloy Films" also requires a specially shaped chamber for electroplating control by Kerr magneto-optic effect measurement. In this apparatus, a source of polarized light is arranged to direct light for reflection from a magnetized surface being electroplated. A control signal is derived from the changes in polarization of the light upon reflection due to the Kerr magneto-optic effect.

BRIEF SUMMARY OF THE INVENTION

According to the present invention, a Kerr magneto-optic effect probe comprises a core of magnetic material having adjacent pole tips, arranged to provide a magnetic field between the pole tips, an input light path including a light waveguide and a polarizer for directing polarized light onto a surface adjacent to the pole tips and an output light path including a light waveguide and an analyzer for conducting light reflected from said surface to a light detector.

Embodiments of the present invention provide a Kerr effect probe which may be used to examine surfaces of magnetic material during electroplating or vacuum deposition without the necessity of requiring a specially shaped chamber. This results from the use of a core of magnetic material in conjunction with light waveguides providing a miniature probe which may be placed inside the chamber.

BRIEF DESCRIPTION OF THE DRAWINGS

In order that the invention may be more readily understood, reference will now be made, by way of example, to the accompanying drawings in which:

FIG. 4 shows an alternative Kerr magneto-optic effect probe providing a second embodiment of the present invention.

FIG. 5 shows another Kerr magneto-optic probe.

FIG. 6 shows an alternative core shape which may replace the core shown in the embodiments of the invention illustrated in FIGS. 1, 4 and 5.

DESCRIPTION OF THE PREFERRED EMBODIMENT

Figure 1:
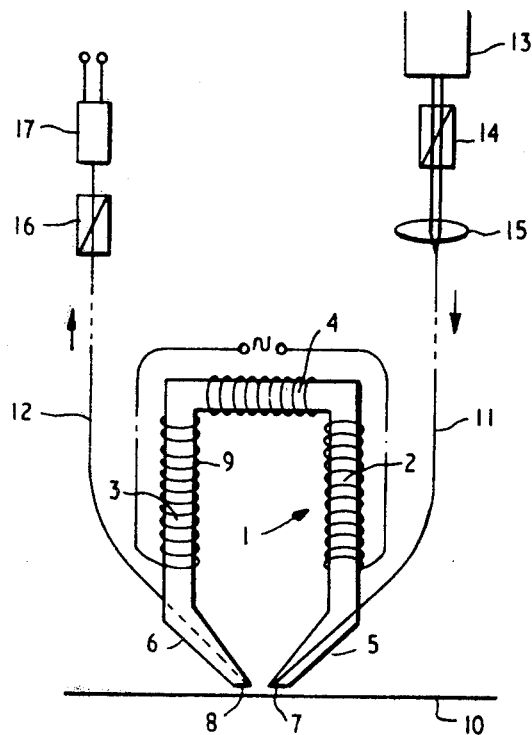
FIG. 1 shows a Kerr magneto-optic effect probe embodying the present invention.

Referring to FIG. 1, a generally U-shaped core 1 of soft magnetic material is shown having legs 2, 3 joined at their upper ends by member 4. The lower ends of legs 2, 3 terminate in tapered portions 5, 6 which bend inwards from legs 2, 3 at equal angles to provide, respectively, adjacent pole tips 7, 8. A coil 9 of copper wire is wound on core 1 around legs 2, 3 and member 4 to magnetize the core when an electric current is passed through coil 9 and provide a magnetic field between pole tips 7 and 8.

An input optic fiber 11 is shown which has a straight vertical portion and bends gradually to pass through tapered portion 5 to emerge at pole tip 7. Similarly shaped optic fiber 12 has a straight portion and passes through tapered portion 6 to emerge at pole tip 8. The lower ends of optic fibers 11 and 12 have the same angular inclination to the vertical legs 2, 3. This is to ensure that a surface 10 in a horizontal plane will reflect input light from optic fiber 11 to provide output light in optic fiber 12. Polarized light is applied to the upper end of optic fiber 11 by means of Helium/Neon laser 13 or other suitable light source, polarizer 14 and lens 15. When the probe is in use, polarized light transmitted by optic fiber 11 is reflected by surface 10 in the presence of a magnetic field generated by energized core 1, and due to the Kerr magneto-optic effect, light having changed polarization enters the lower end of optic fiber 12. This polarized light is conducted to analyzer 16 and optical detector 17 whose electrical output enables the change in polarization due to Kerr magneto-optic effect to be measured.

Figures 2, 3:
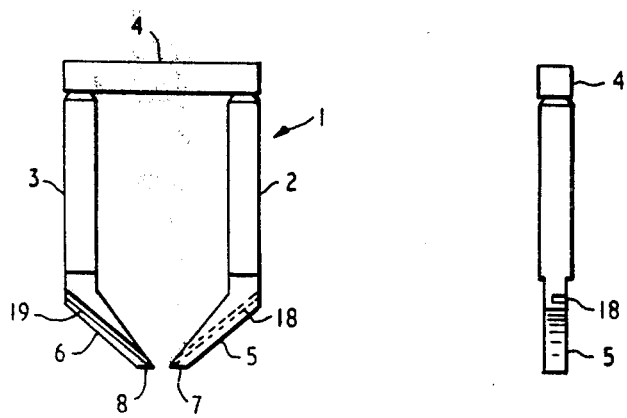
FIG. 2 shows the construction of a ferrite core which may be used in the probe of FIG. 1.
FIG. 3 is a side elevation of FIG. 2.

FIGS. 2 and 3 show the construction of a soft magnetic core 1 which may be used in the probe of FIG. 1, and uses the same reference numerals. The three parts, member 4 and legs 2, 3 are machined from blocks of soft magnetic ferrite material. It will be noted that for ease of manufacture legs 2 and 3 are identical. Slots 18, 19 are ground in tapered portions 5, 6 respectively to accommodate optic fibers. As shown in FIG. 3, the tapered portions 5, 6 are of reduced cross-section as compared to legs 2, 3 to minimize shielding effects when used in a plating bath. Slots 18, 19 are each at an angle of 45° to the vertical. However, it may be appropriate in some application to use an angle of 60°. After machining, legs 2 and 3 are bonded to member 4 to form the generally U-shaped core 1.

A ferrite core as shown in FIGS. 2 and 3 was fabricated having an overall length of approximately 2.5 cm and a coil 9 of 70 turns as shown in FIG. 1 wound on core 1. This produced a magnetic field of approximately 1900 Oersted for a 1 watt dissipation in the coil. This magnetic field is suitable for Kerr magneto-optic effect measurements when the pole tips 7, 8 are placed approximately 0.25 mm from a surface of hard magnetic material.

The relatively simple optical system of FIG. 1 depends upon the use of optic fibers. These fibers are required to pass polarized light and produce a parallel beam or focussed output. Conventional glass fibers do not have these properties but graded refractive index fibers will. This type of fiber is commercially available from the Nippon Electric Co., Tokyo, Japan under the name of Selfoc (Registered Trade Mark) fibers.

A description of these fibers is contained in the following publications: Guide to SELFOC, Nippon Electric Company Limited, June 1971, and K. Matsushita and K. Ikeda, New Developed Glass Devices for Image Transmission, Proceedings of the Society of Photo-optical Instrumentation Engineers, Volume 31, 16–17 October, 1972, pages 23 to 35.

These graded refractive index fibers will produce a focussed or parallel output beam of light dependent upon length and upon the input beam. The use of these graded refractive index fibers enables the arrangement as shown in FIG. 1 to be constructed with only the optical fibers 11, 12 associated with core 1, all other optical components being remote from the core. One disadvantage of these optical fibers is that they are relatively stiff and require a large bending radius as shown in FIG. 1.

In fabricating the ferrite core shown in FIGS. 2 and 3, an alternative to grinding narrow slots 18, 19 is to drill equivalent holes for the optic fibers by laser drilling.

FIG. 4 illustrates a second embodiment of the invention which avoids the difficulties of the large bending radius of the optic fibers as shown in FIG. 1. Where possible the same reference numerals as in FIG. 1 are used. As the same U-shaped core 1 is used, only the differences will be described in detail. The major difference is that the use of total internal reflection prisms 20, 21 enables straight lengths 22, 23, 24 and 25 of graded refractive index fibers to replace the curved optic fibers 11, 12 of FIG. 1.

In operation, light generated by semiconductor laser 26 passes through polarizer 14 and lens 15 to straight fiber 22 lying alongside leg 2 to be reflected by prism 20 along straight fiber 24 mounted within tapered portion 24. After reflection from an adjacent surface (not shown) the light having changed polarization due to the Kerr magneto-optic effect enters straight fiber 25 and is reflected by prism 21 to straight fiber 23 alongside leg 3. Detection is by analyzer 16 and semiconductor detector 17.

A further embodiment of the present invention is shown in FIG. 5. This uses a very similar soft magnetic core 1 and coil 9 as in FIG. 1 and will not be described in detail again. The difference is that a polarizer 30 is mounted at pole tip 7 and an analyzer 31 is mounted at pole tip 8. It will be noted that pole tips 7 and 8 are at right angles to the light path at the pole tips. Miniature polarizers 30 and analyzers 31 having sizes in the order of 1 mm cubes are available commercially. As shown in FIG. 5, fibers 11 and 12 must be of the graded refractive index type to enable the use of parallel or focussed light beams for Kerr opto-magnetic measurements. However, it may be possible to employ conventional optic fibers providing additional lenses are included at the pole tips to generate the required parallel or focussed beams.

Core 1 does not have to be U-shaped. Other shapes such as core 35 shown in FIG. 6 may be employed. In general, the cores should have circular cross-section to improve coil-core performance by reducing air gaps. The cores can be prepared by plating techniques as described in the next paragraph.

It is conventional in the art to electroplate soft magnetic materials such as nickel iron alloys. Thus, for example, core 1 or 35 may be fabricated by electroplating a soft magnetic material onto a suitable conductive support. The support might include tubes of internal diameters slightly greater than the fibers to be used to allow the fibers to pass to the pole tips. Also, it is advantageous from the point of view of magnetic efficiency to form the coil 9 by copper plating and/or etching techniques as this gives minimum air gap between the magnetic core and the winding. Also, some advantage may be gained if the cross-section of core 1 or 35 is made circular when using a wound coil.

FIGS. 1 to 6 are all drawn illustrating the use of what is called the longitudinal Kerr Effect in which the plane of incidence of polarized light is parallel to the direction of the magnetic field between the pole tips. However, the apparatus may be modified to use the transverse or polar Kerr effect.

For the transverse Kerr Effect, the plane of incidence of the polarized light is perpendicular to the direction of the magnetic field between the pole tips. This requires the optic fibers to be supported so that the tips of the fibers are at right angles to the positions shown in the drawings for longitudinal Kerr Effect.

For the polar Kerr Effect, the direction of the incident and reflected light is perpendicular to the magnetic field between the pole tips which is parallel to the surface 10 under examination. This requires that the optic fibers are supported so that the tips of the fibers are perpendicular to surface 10.

Polar Kerr Effect has particular applications for magnetic bubble domain materials and devices.

Having thus described our invention, what we claim as new and desire to secure by Letters Patent is:

1. A Kerr magneto-optic effect probe having a tip portion which may be inserted into an electroplating bath or vacuum deposition chamber and positioned adjacent to a surface upon which magnetic material may be deposited, for examination thereof, comprising:
a magnetic core having adjacent magnetic pole tips for generating a magnetic field therebetween and along an adjacent surface to be examined;
an input light path including an input light waveguide and a polarizer for directing polarized light onto the surface in the region of the magnetic field; and
an output light path including an output light waveguide and an analyzer for conducting light reflected from the surface to a light detector, at least one end of said input and output light waveguides being supported in predetermined relationship to said pole tips for common movement thereof with respect to and within an electroplating or vacuum deposition chamber.

2. A probe as claimed in claim 1 in which said mgnetic core is generally U-shaped.

3. A probe as claimed in claim 1 in which said magnetic core is generaly circular but elongated towards the pole tips.

4. A probe as claimed in claim 1 in which said core is of soft magnetic material and has a conductive coil winding for providing said magnetic field.

5. A probe as claimed in claim 1 in which said core is of hard magnetic material magnetized to provide said magnetic field between the pole tips.

6. A probe as claimed in claim 1 in which said light waveguides comprise optical fibers.

7. A probe as claimed in claim 6 in which said input light waveguide directs light in a direction substantially parallel to said magnetic field.

8. A probe as claimed in claim 7 in which said optical fibers pass through said pole tips.

9. A probe as claimed in claim 1 in which said polarizer and analyzer are adjacent to said pole tips.

10. A probe as claimed in claim 1 in which said polarizer and analyzer are remote from said pole tips and said light waveguides comprise graded refractive index optical fibers.

11. A probe as claimed in claim 9 in which said light paths each include a prism.

12. A probe as claimed in claim 6 in which said light paths are remote from said magnetic core, and said input light waveguide directs light along a direction substantially transverse to said magnetic field.

* * * * *